(12) United States Patent
Yanagihara

(10) Patent No.: US 12,348,197 B2
(45) Date of Patent: Jul. 1, 2025

(54) MULTI-FINGER TRANSISTOR AND POWER AMPLIFIER CIRCUIT

(71) Applicant: Murata Manufacturing Co., Ltd., Kyoto (JP)

(72) Inventor: Shingo Yanagihara, Kyoto (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 752 days.

(21) Appl. No.: 17/237,276

(22) Filed: Apr. 22, 2021

(65) Prior Publication Data

US 2021/0336591 A1    Oct. 28, 2021

(30) Foreign Application Priority Data

Apr. 28, 2020 (JP) ................. 2020-079823
Nov. 9, 2020 (JP) ................. 2020-186655

(51) Int. Cl.
*H03F 1/07* (2006.01)
*H03F 3/195* (2006.01)
*H03F 3/24* (2006.01)

(52) U.S. Cl.
CPC ............ *H03F 3/195* (2013.01); *H03F 3/245* (2013.01); *H03F 2200/451* (2013.01)

(58) Field of Classification Search
CPC .................................. H03F 1/07; H03F 1/02
USPC ............................................. 330/124 R, 295
See application file for complete search history.

(56) References Cited

U.S. PATENT DOCUMENTS

| | | | |
|---|---|---|---|
| 5,867,061 A | 2/1999 | Rabjohn et al. | |
| 7,190,219 B2* | 3/2007 | Burns | H03F 3/211 330/129 |
| 7,486,141 B2* | 2/2009 | Do | H03F 3/265 330/276 |
| 7,961,048 B2 | 6/2011 | Oakley et al. | |
| 8,130,041 B2* | 3/2012 | Kim | H03F 3/245 330/207 P |
| 8,547,174 B1 | 10/2013 | Schemmann et al. | |
| 8,917,145 B2* | 12/2014 | Song | H03F 1/32 330/295 |
| 9,705,451 B2 | 7/2017 | Takenaka et al. | |
| 11,671,061 B2* | 6/2023 | Gebeyehu | H04B 1/401 330/276 |

(Continued)

FOREIGN PATENT DOCUMENTS

WO    2015/001851 A1    1/2015

*Primary Examiner* — Henry Choe
(74) *Attorney, Agent, or Firm* — McDonald Hopkins LLC

(57) ABSTRACT

A multi-finger transistor includes unit transistors each including a first terminal electrically connected to a reference potential, a second terminal that receives an RF signal and a bias current, and a third terminal that outputs an amplified signal; a common input terminal electrically connected in parallel to the second terminals of the unit transistors and that receives the RF signal; a common bias terminal electrically connected in parallel to the second terminals of the unit transistors and that receives the bias current; a common output terminal electrically connected in parallel to the third terminals of the unit transistors and that outputs the amplified signal; and first resistance elements each of which is electrically connected between the common input terminal and the second terminal of a corresponding one of the unit transistors and each of which cuts a DC component of the bias current.

7 Claims, 3 Drawing Sheets

(56) References Cited

U.S. PATENT DOCUMENTS

| | | |
|---|---|---|
| 2004/0145402 A1 | 7/2004 | Burns et al. |
| 2007/0152751 A1 | 7/2007 | Do et al. |
| 2009/0231033 A1* | 9/2009 | Yamada .............. H03F 3/45475 |
| | | 330/124 R |
| 2010/0148877 A1* | 6/2010 | Oakley ................... H03F 3/604 |
| | | 330/253 |
| 2012/0200359 A1* | 8/2012 | Karthaus ................. H03F 3/245 |
| | | 330/291 |
| 2015/0054581 A1* | 2/2015 | Omid-Zohoor ......... H03F 3/211 |
| | | 330/277 |
| 2015/0180423 A1* | 6/2015 | Sankaranarayanan .... H03F 3/68 |
| | | 330/295 |
| 2016/0056769 A1 | 2/2016 | Takenaka et al. |

* cited by examiner

MULTI-FINGER TRANSISTOR AND POWER AMPLIFIER CIRCUIT

CROSS REFERENCE TO RELATED APPLICATION

This application claims priority from Japanese Patent Application No. 2020-079823 filed on Apr. 28, 2020 and Japanese Patent Application No. 2020-186655 filed on Nov. 9, 2020. The contents of these applications are incorporated herein by reference in its entirety.

BACKGROUND

The present disclosure relates to a multi-finger transistor and a power amplifier circuit. International Publication No. 2015/001851 describes a power amplifier module including a transistor. According to International Publication No. 2015/001851, an alternating current (AC) signal is input to the base of the transistor without necessarily via a direct current (DC) cut capacitor.

BRIEF SUMMARY

An amplifier circuit may include a multi-finger transistor including a plurality of unit transistors (also referred to as fingers) that are electrically connected in parallel to each other. Each unit transistor is a minimum element of the transistor. In the present disclosure, a multi-finger transistor is defined as a transistor that includes a plurality of unit transistors connected in parallel to each other so as to behave as a single transistor circuit and that includes a plurality of emitters.

When the bases of a plurality of unit transistors are electrically connected in parallel to each other without necessarily via a DC cut capacitor, a large bias current may flow into the base of one of the unit transistors. For example, a difference in temperature between the unit transistors may cause a difference in input impedance (input resistance) between the bases of the unit transistors. Also, for example, an individual difference between the unit transistors may cause a difference in input impedance between the bases of the unit transistors. In this case, a large bias current flows into the base of the unit transistor having the lowest input impedance, and the bias current flowing into the bases of the other unit transistors decreases accordingly. This results in uneven operation of the plurality of unit transistors. The uneven operation of the plurality of unit transistors hinders a desired amplification characteristic from being obtained.

The present disclosure achieves even operation of a plurality of unit transistors.

According to embodiments of the present disclosure, a multi-finger transistor includes a plurality of unit transistors each including a first terminal that is electrically connected to a reference potential, a second terminal that receives a radio-frequency signal and a bias current, and a third terminal that outputs an amplified signal obtained by amplifying the radio-frequency signal; a common input terminal that is electrically connected in parallel to the second terminals of the plurality of unit transistors and that receives the radio-frequency signal; a common bias terminal that is electrically connected in parallel to the second terminals of the plurality of unit transistors and that receives the bias current; a common output terminal that is electrically connected in parallel to the third terminals of the plurality of unit transistors and that outputs the amplified signal; and a plurality of first resistance elements each of which is electrically connected between the common input terminal and the second terminal of a corresponding one of the plurality of unit transistors and each of which cuts a direct current component of the bias current.

According to embodiments of the present disclosure, a power amplifier circuit includes a balun including a primary winding that receives a first radio-frequency signal and a secondary winding that outputs a second radio-frequency signal; and the above-described multi-finger transistor in which the common input terminal receives the second radio-frequency signal.

According to the embodiments of the present disclosure, it is possible to achieve even operation of a plurality of unit transistors.

Other features, elements, characteristics and advantages of the present disclosure will become more apparent from the following detailed description of embodiments of the present disclosure with reference to the attached drawings.

DETAILED DESCRIPTION

Hereinafter, a multi-finger transistor and a power amplifier circuit according to embodiments of the present disclosure will be described in detail with reference to the attached drawings. Note that the embodiments described below do not limit the present disclosure. Each embodiment is merely an example, and it is obviously possible to partially replace or combine elements described in different embodiments. In a second embodiment, the same features as those of a first embodiment will not be described, and only differences will be described. In particular, similar functions and effects of similar configurations will not be repeatedly described in each embodiment.

First Embodiment and Comparative Example

Hereinafter, a first embodiment will be described. To facilitate the understanding of the first embodiment, a comparative example will be described first.

Comparative Example

Figure 1:
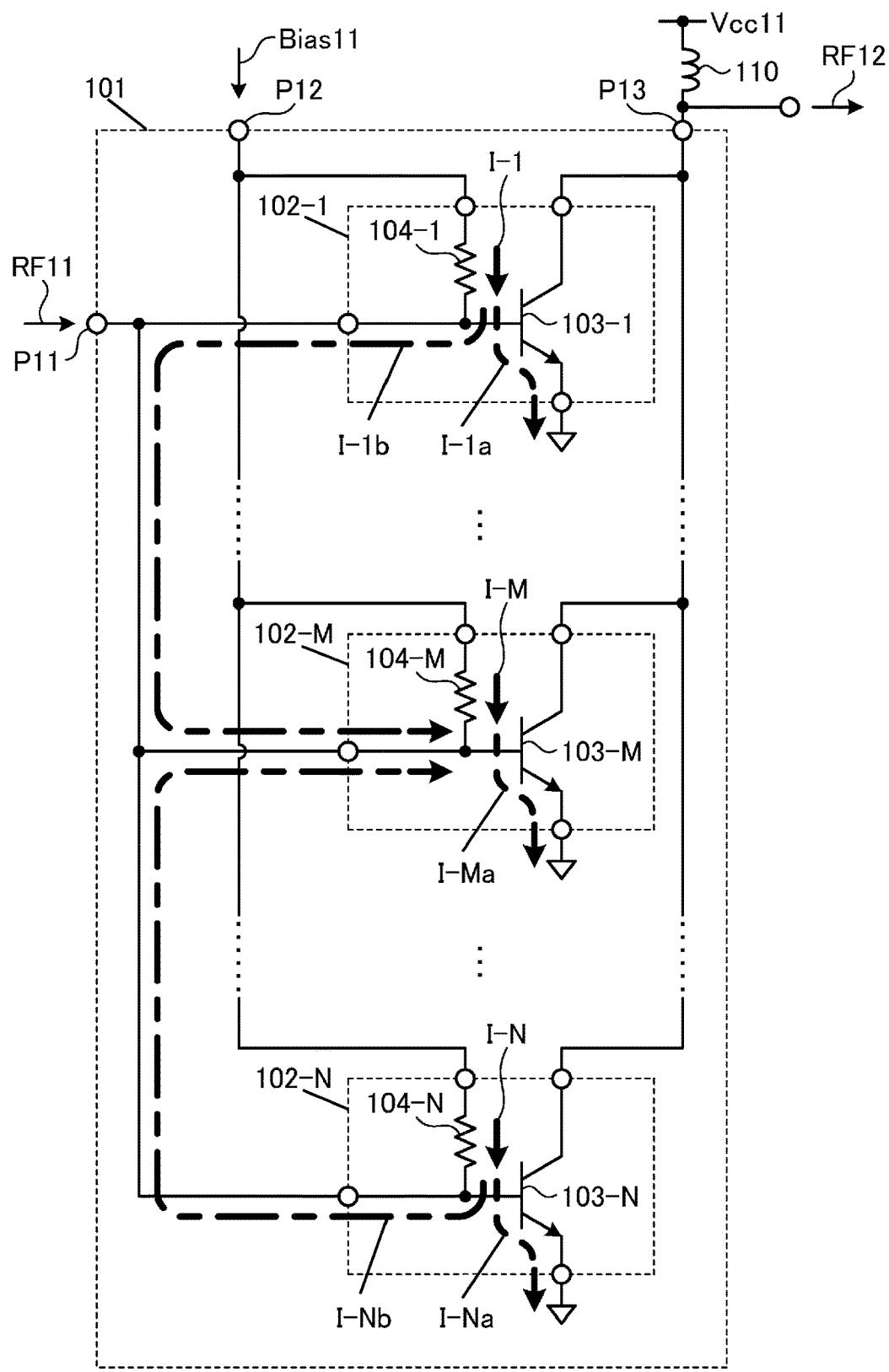
FIG. 1 is a diagram illustrating the configuration of a multi-finger transistor according to a comparative example.

FIG. 1 is a diagram illustrating the configuration of a multi-finger transistor 101 according to the comparative example. The multi-finger transistor 101 includes a plurality of unit transistors electrically connected in parallel to each other. Each unit transistor is a minimum element of the transistor.

The multi-finger transistor 101 includes a first terminal P11 that receives an alternating current (AC) signal RF11, a second terminal P12 that receives a bias current Bias11, and a third terminal P13 that outputs an AC signal RF12. The third terminal P13 is electrically connected to a power supply potential Vcc11 via a choke inductor 110.

The multi-finger transistor 101 receives power supplied from the power supply potential Vcc11 and is brought into an electric bias state by the bias current Bias11. The multi-finger transistor 101 amplifies the AC signal RF11 and outputs the amplified AC signal RF12.

The multi-finger transistor 101 includes N cells 102-1 to 102-N. N is an integer greater than or equal to 2. The cell 102-1 includes a unit transistor 103-1 and a resistor 104-1. The cell 102-M includes a unit transistor 103-M and a resistor 104-M. M is an integer greater than 1 and smaller than N. The cell 102-N includes a unit transistor 103-N and a resistor 104-N. The resistors 104-1 to 104-N, each has a resistance value of, for example, about 180Ω to 200Ω. Note that the present disclosure is not limited thereto.

In the present disclosure, a unit transistor is a bipolar transistor, but the present disclosure is not limited thereto. The bipolar transistor may be a heterojunction bipolar transistor (HBT), but the present disclosure is not limited thereto. The unit transistor may be, for example, a field-effect transistor (FET).

The emitter or source of each unit transistor corresponds to an example of a "first terminal" of the present disclosure. The base or gate of each unit transistor corresponds to an example of a "second terminal" of the present disclosure. The collector or drain of each unit transistor corresponds to an example of a "third terminal" of the present disclosure.

The emitter of each unit transistor 103 is electrically connected to a reference potential. The reference potential may be a ground potential, but the present disclosure is not limited thereto. The base of each unit transistor 103 is electrically connected to the first terminal P11. One end of each resistor 104 is electrically connected to the second terminal P12. The other end of each resistor 104 is electrically connected to the base of the corresponding unit transistor 103. The collector of each unit transistor 103 is electrically connected to the third terminal P13.

It is assumed that the AC signal RF11 does not contain a direct current (DC) component but contains only an AC component. Thus, each cell 102 does not need to include a DC cut capacitor in the path between the first terminal P11 and the base of the corresponding unit transistor 103.

A current I-1 flows through the resistor 104-1. A current I-M flows through the resistor 104-M. A current I-N flows through the resistor 104-N. The sum of the currents I-1 to I-N is equal to the bias current Bias11.

If the individual unit transistors 103 have the same electric characteristics, all the current I-1 flows through a base-emitter path of the unit transistor 103-1, all the current I-M flows through a base-emitter path of the unit transistor 103-M, and all the current I-N flows through a base-emitter path of the unit transistor 103-N.

However, for example, a difference in temperature between the unit transistors 103 may cause a difference in input impedance (input resistance) between the bases of the unit transistors 103. Also, for example, an individual difference between the unit transistors 103 may cause a difference in input impedance between the bases of the unit transistors 103.

Here, it is assumed that the input impedance of the unit transistor 103-M is lower than the input impedances of the other unit transistors 103, in other words, the unit transistor 103-M has the lowest input impedance.

In this case, a part of the current I-1 flows, as a current I-1a, through the base-emitter path of the unit transistor 103-1, whereas the other part of the current I-1 flows, as a current I-1b, through the base-emitter path of the unit transistor 103-M. Likewise, a part of the current I-N flows, as a current I-Na, through the base-emitter path of the unit transistor 103-N, whereas the other part of the current I-N flows, as a current I-Nb, through the base-emitter path of the unit transistor 103-M.

Thus, a current I-Ma flowing through the base-emitter path of the unit transistor 103-M is the sum of the current I-M and the currents flowing thereinto from the other cells. This causes a large bias current to flow through the base-emitter path of the unit transistor 103-M and causes a small bias current to flow through the base-emitter paths of the other unit transistors 103. This results in uneven operation of the plurality of unit transistors 103. The uneven operation of the plurality of unit transistors 103 hinders a desired amplification characteristic from being obtained.

First Embodiment

Figure 2:
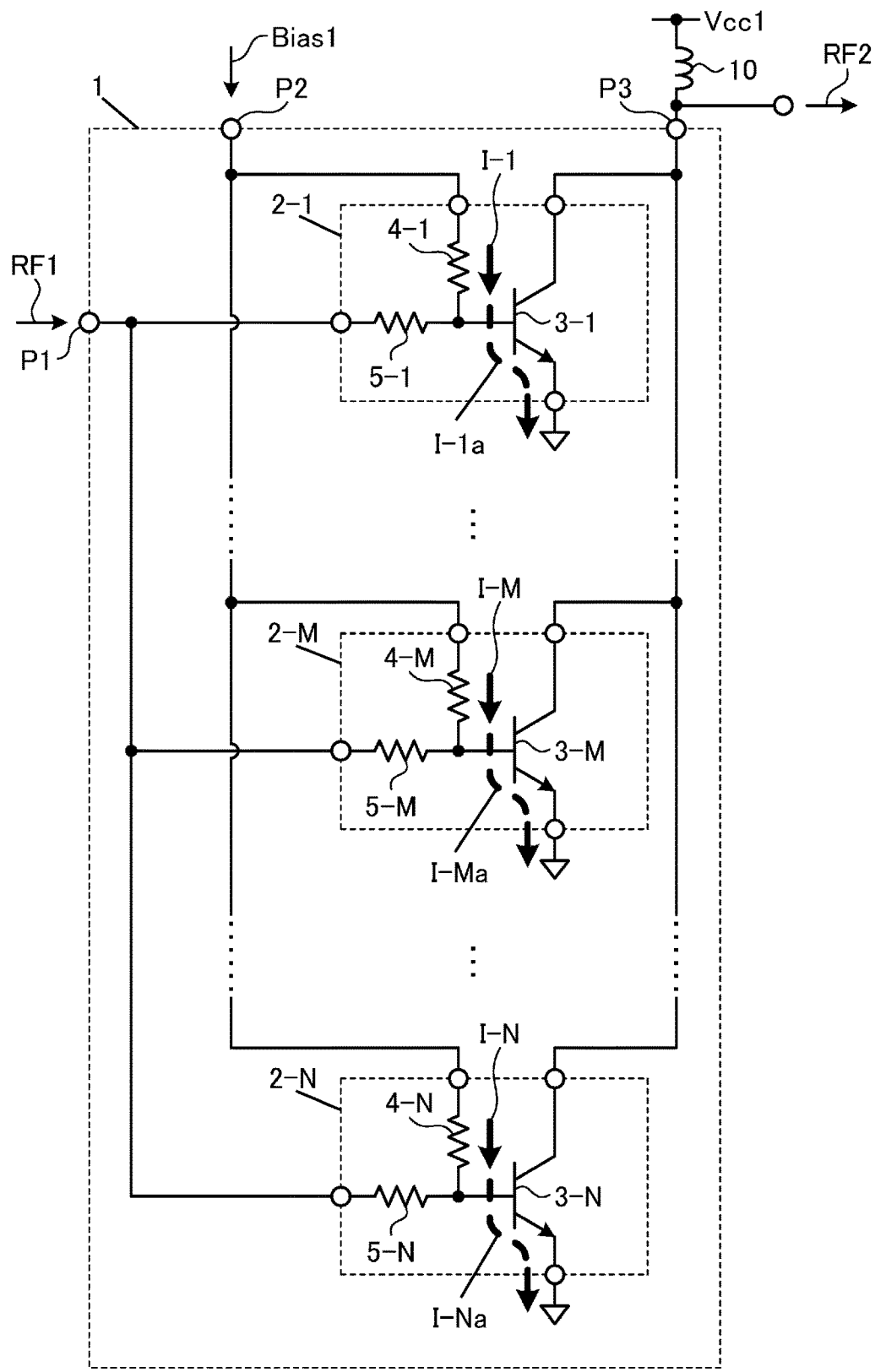
FIG. 2 is a diagram illustrating the configuration of a multi-finger transistor according to a first embodiment.

FIG. 2 is a diagram illustrating the configuration of a multi-finger transistor 1 according to the first embodiment. The multi-finger transistor 1 includes a plurality of unit transistors electrically connected in parallel to each other. Each unit transistor is a minimum element of the transistor.

The multi-finger transistor 1 includes a first terminal P1 that receives an AC signal RF1, a second terminal P2 that receives a bias current Bias1, and a third terminal P3 that outputs an AC signal RF2. The third terminal P3 is electrically connected to a power supply potential Vcc1 via a choke inductor 10.

The first terminal P1 corresponds to an example of a "common input terminal" of the present disclosure. The second terminal P2 corresponds to an example of a "common bias terminal" of the present disclosure. The third terminal P3 corresponds to an example of a "common output terminal" of the present disclosure.

The multi-finger transistor 1 receives power supplied from the power supply potential Vcc1 and is brought into an electric bias state by the bias current Bias1. The multi-finger transistor 1 amplifies the AC signal RF1 and outputs the amplified AC signal RF2.

The multi-finger transistor 1 includes N cells 2-1 to 2-N. The cell 2-1 includes a unit transistor 3-1, a resistor 4-1, and a resistor 5-1. The cell 2-M includes a unit transistor 3-M, a resistor 4-M, and a resistor 5-M. The cell 2-N includes a unit transistor 3-N, a resistor 4-N, and a resistor 5-N. The resistors 4-1 to 4-N, each has a resistance value of, for example, about 180Ω to 200Ω. Note that the present disclosure is not limited thereto. The resistors 5-1 to 5-N, each has a resistance value of, for example, about 1Ω. Note that the present disclosure is not limited thereto. The resistors 5-1 to 5-N, each has, for example, a smaller resistance value than the resistance value of a corresponding one of the resistors 4-1 to 4-N. Note that the present disclosure is not limited thereto. The resistors 4-1 to 4-N, each has, for example, a resistance value that is five times or more the resistance value of a corresponding one of the resistors 5-1 to 5-N. Note that the present disclosure is not limited thereto.

The resistors 5 correspond to an example of "first resistance elements" of the present disclosure. The resistors 4 correspond to an example of "second resistance elements" of the present disclosure.

The emitter of each unit transistor 3 is electrically connected to a reference potential. One end of each resistor 5 is electrically connected to the base of the corresponding unit transistor 3. The other end of each resistor 5 is electrically connected to the first terminal P1. One end of each resistor 4 is electrically connected to the base of the corresponding unit transistor 3. The other end of each resistor 4 is electrically connected to the second terminal P2. The collector of each unit transistor 3 is electrically connected to the third terminal P3.

The AC signal RF1 contains only an AC component. Thus, each cell 2 does not need to include a DC cut capacitor in the path between the first terminal P1 and the base of the corresponding unit transistor 3.

A current I-1 flows through the resistor 4-1. A current I-M flows through the resistor 4-M. A current I-N flows through the resistor 4-N. The sum of the currents I-1 to I-N is equal to the bias current Bias1.

For example, a difference in temperature between the unit transistors 3 may cause a difference in input impedance (input resistance) between the bases of the unit transistors 3. Also, for example, an individual difference between the unit transistors 3 may cause a difference in input impedance between the bases of the unit transistors 3.

Here, it is assumed that the input impedance of the unit transistor 3-M is lower than the input impedances of the other unit transistors 3, in other words, the unit transistor 3-M has the lowest input impedance.

However, the one end of each resistor 4 is electrically connected to the base of the corresponding unit transistor 3 and is also electrically connected to the one end of the corresponding resistor 5.

The presence of the resistor 5-1 hinders the current I-1 flowing through the resistor 4-1 from flowing toward the resistor 5-1, and thus the current I-1 becomes a current I-1a flowing through a base-emitter path of the unit transistor 3-1. Likewise, the presence of the resistor 5-M hinders the current I-M flowing through the resistor 4-M from flowing toward the resistor 5-M, and thus the current I-M becomes a current I-Ma flowing through a base-emitter path of the unit transistor 3-M. Likewise, the presence of the resistor 5-N hinders the current I-N flowing through the resistor 4-N from flowing toward the resistor 5-N, and thus the current I-N becomes a current I-Na flowing through a base-emitter path of the unit transistor 3-N.

Accordingly, uneven operation of the unit transistors 3 is suppressed, and thus a desired amplification characteristic is obtained.

Each resistor 5 will be illustrated below, but the present disclosure is not limited thereto.

When a multi-finer transistor is regarded as a single transistor, a combined resistance of each resistor 5 is, for example, about 0.5Ω or more. Thus, the resistance value of the resistors 5 connected to the unit transistors is, when the number of unit transistors is N, for example, about (0.5×N)Ω or more.

The resistance value of each resistor 5 is, for example, smaller than the resistance value of an emitter ballast resistor of the corresponding unit transistor 3. The emitter ballast resistor has, for example, about 200Ω, but the present disclosure is not limited thereto.

The resistance value of each resistor 5 is, for example, a resistance value corresponding to the impedance of a DC cut capacitor that is typically connected to the base of the corresponding unit transistor 3, but the present disclosure is not limited thereto. For example, it is typically assumed that, when the AC signal RF1 has a frequency in the band of about 0.9 GHz, a DC cut capacitor of about 2 pF is connected in series to the base of each unit transistor 3. In this case, the resistance value corresponding to an impedance of about $(1/\omega C)$ of the DC cut capacitor is about 88Ω.

Second Embodiment

Figure 3:
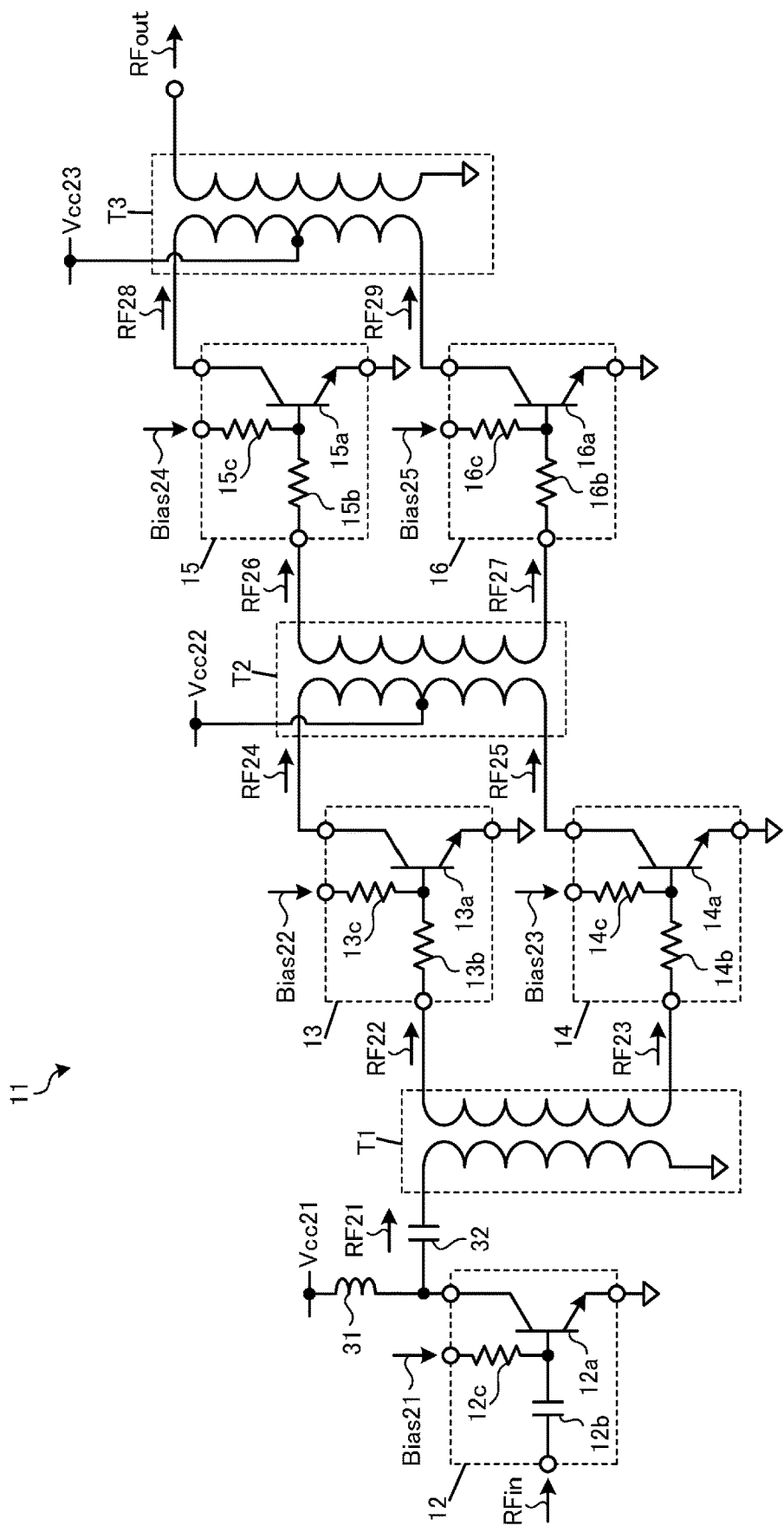
FIG. 3 is a diagram illustrating the configuration of a power amplifier circuit according to a second embodiment.

FIG. 3 is a diagram illustrating the configuration of a power amplifier circuit 11 according to a second embodiment. Specifically, FIG. 3 is a diagram illustrating the configuration of the power amplifier circuit 11 to which the multi-finger transistor 1 according to the first embodiment is applied.

The power amplifier circuit 11 may be implemented by a hybrid integrated circuit (IC) or module in which a plurality of components (semiconductor chips or the like) are mounted on a single substrate, but the present disclosure is not limited thereto.

The power amplifier circuit 11 includes a multi-finger transistor 12 serving as a first-stage power amplifier, multi-finger transistors 13 and 14 serving as second-stage power amplifiers, and multi-finger transistors 15 and 16 serving as third-stage power amplifiers. The number of stages of the power amplifiers is not limited to three, and may be two or less, or may be four or more.

The multi-finger transistor 12 is a typical multi-finger transistor in which a DC cut capacitor is connected in series to the base thereof. The multi-finger transistors 13 to 16, each has the same circuit configuration as that of the multi-finger transistor 1 according to the first embodiment (see FIG. 2).

The multi-finger transistor 12 includes cells each including a unit transistor 12a, a DC cut capacitor 12b, and a resistor 12c.

The emitter of the unit transistor 12a of each cell of the multi-finer transistor 12 is electrically connected to a reference potential. A radio-frequency (RF) input signal RFin is input to the base of the unit transistor 12a of each cell via the DC cut capacitor 12b of the cell. A bias current Bias21 is input to the base of the unit transistor 12a of each cell via the resistor 12c of the cell. The collector of the unit transistor 12a of each cell is electrically connected to a power supply potential Vcc21 via a choke inductor 31. The unit transistor 12a of each cell outputs an RF signal RF21 from the collector to one end of a primary winding of a balun T1 via a DC cut capacitor 32.

The other end of the primary winding of the balun T1 is electrically connected to the reference potential. An RF signal RF22 is output from one end of a secondary winding of the balun T1 to the base of the multi-finger transistor 13. An RF signal RF23 is output from the other end of the secondary winding of the balun T1 to the base of the multi-finger transistor 14.

The multi-finger transistor 13 includes cells each including a unit transistor 13a and resistors 13b and 13c.

The emitter of the unit transistor 13a of each cell of the multi-finer transistor 13 is electrically connected to the reference potential. The RF signal RF22 is input to the base of the unit transistor 13a of each cell via the resistor 13b of the cell.

The RF signal RF22 output from the secondary winding of the balun T1 does not contain a DC component, and thus a DC cut capacitor is optional between the secondary winding of the balun T1 and the base of the unit transistor 13a of each cell.

A bias current Bias22 is input to the base of the unit transistor 13a of each cell via the resistor 13c of the cell. The collector of the unit transistor 13a of each cell is electrically connected to one end of a primary winding of a balun T2. The unit transistor 13a of each cell outputs an RF signal RF24 from the collector to the one end of the primary winding of the balun T2.

The multi-finger transistor 14 includes cells each including a unit transistor 14a and resistors 14b and 14c.

The emitter of the unit transistor 14a of each cell of the multi-finer transistor 14 is electrically connected to the reference potential. The RF signal RF23 is input to the base of the unit transistor 14a of each cell via the resistor 14b of the cell.

The RF signal RF23 output from the secondary winding of the balun T1 does not contain a DC component, and thus a DC cut capacitor is optional between the secondary winding of the balun T1 and the base of the unit transistor 14a of each cell.

A bias current Bias23 is input to the base of the unit transistor 14a of each cell via the resistor 14c of the cell. The collector of the unit transistor 14a of each cell is electrically connected to the other end of the primary winding of the balun T2. The unit transistor 14a of each cell outputs an RF signal RF25 from the collector to the other end of the primary winding of the balun T2.

The midpoint of the primary winding of the balun T2 is electrically connected to a power supply potential Vcc22. The power supply potential Vcc22 is supplied to the collectors of the multi-finger transistors 13 and 14 via the primary winding of the balun T2.

An RF signal RF26 is output from one end of a secondary winding of the balun T2 to the base of the multi-finger transistor 15. An RF signal RF27 is output from the other end of the secondary winding of the balun T2 to the base of the multi-finger transistor 16.

The multi-finger transistor 15 includes cells each including a unit transistor 15a and resistors 15b and 15c.

The emitter of the unit transistor 15a of each cell of the multi-finer transistor 15 is electrically connected to the reference potential. The RF signal RF26 is input to the base of the unit transistor 15a of each cell via the resistor 15b of the cell.

The RF signal RF26 output from the secondary winding of the balun T2 does not contain a DC component, and thus a DC cut capacitor is optional between the secondary winding of the balun T2 and the base of the unit transistor 15a of each cell.

A bias current Bias24 is input to the base of the unit transistor 15a of each cell via the resistor 15c of the cell. The collector of the unit transistor 15a of each cell is electrically connected to one end of a primary winding of a balun T3. The unit transistor 15a of each cell outputs an RF signal RF28 from the collector to the one end of the primary winding of the balun T3.

The multi-finger transistor 16 includes cells each including a unit transistor 16a and resistors 16b and 16c.

The emitter of the unit transistor 16a of each cell of the multi-finer transistor 16 is electrically connected to the reference potential. The RF signal RF27 is input to the base of the unit transistor 16a of each cell via the resistor 16b of the cell.

The RF signal RF27 output from the secondary winding of the balun T2 does not contain a DC component, and thus a DC cut capacitor is optional between the secondary winding of the balun T2 and the base of the unit transistor 16a of each cell.

A bias current Bias25 is input to the base of the unit transistor 16a of each cell via the resistor 16c of the cell. The collector of the unit transistor 16a of each cell is electrically connected to the other end of the primary winding of the balun T3. The unit transistor 16a of each cell outputs an RF signal RF29 from the collector to the other end of the primary winding of the balun T3.

The midpoint of the primary winding of the balun T3 is electrically connected to a power supply potential Vcc23. The power supply potential Vcc23 is supplied to the collectors of the multi-finger transistors 15 and 16 via the primary winding of the balun T3.

One end of a secondary winding of the balun T3 is electrically connected to the reference potential. An RF output signal RFout is output from the other end of the secondary winding of the balun T3.

With this configuration, the power amplifier circuit 11 does not have a DC cut capacitance in each of the intermediate stage and the output stage, and thus a filter effect, which is based on a time constant determined by the product of the resistances connected to the bias circuit (for example, the resistors 13c, 14c, 15c, and 16c) and the capacitance, is not obtained. Thus, there is no limitation on the band resulting from a modulation band width.

While embodiments of the disclosure have been described above, it is to be understood that variations, modifications, and improvements will be apparent to those skilled in the art without necessarily departing from the scope and spirit of the disclosure. The embodiments are for facilitating the understanding of the present disclosure and are not intended to limit the present disclosure. The present disclosure includes the equivalents thereof. The scope of the disclosure, therefore, is to be determined solely by the following claims.

What is claimed is:

1. A multi-finger transistor comprising:
    a plurality of unit transistors, each unit transistor comprising a first terminal that is electrically connected to a reference potential, a second terminal that is configured to receive a radio-frequency input signal and a bias current, and a third terminal that is configured to output an amplified signal obtained by amplifying the radio-frequency input signal;
    a common input terminal that is electrically connected in parallel to the second terminals of the plurality of unit transistors, and that is configured to receive the radio-frequency input signal;
    a common bias terminal that is electrically connected in parallel to the second terminals of the plurality of unit transistors, and that is configured to receive the bias current;
    a common output terminal that is electrically connected in parallel to the third terminals of the plurality of unit transistors, and that is configured to output the amplified signal; and
    a plurality of first resistance elements, each resistance element being electrically connected between the common input terminal and the second terminal of a corresponding one of the plurality of unit transistors, and each resistance element being configured to limit a direct current component of the bias current between the second terminals of the plurality of unit transistors,
    wherein there is no DC cut capacitor between the common input terminal and the second terminals of the plurality of unit transistors.

2. The multi-finger transistor according to claim 1, further comprising:
    a plurality of second resistance elements, each second resistance element being electrically connected between the common bias terminal and the second terminal of a corresponding one of the plurality of unit transistors,
    wherein each of the plurality of first resistance elements has a resistance value that is less than a resistance value of a corresponding one of the plurality of second resistance elements.

3. The multi-finger transistor according to claim 2, wherein the resistance value of each of the plurality of second resistance elements is five times or more than the resistance value of the corresponding one of the plurality of first resistance elements.

4. A power amplifier circuit comprising:
a balun comprising a primary winding that is configured to receive a first radio-frequency signal, and a secondary winding that is configured to output a second radio-frequency signal; and
the multi-finger transistor according to claim 1, wherein the common input terminal is configured to receive the second radio-frequency signal as the radio-frequency input signal.

5. A power amplifier circuit comprising:
a balun comprising a primary winding that is configured to receive a first radio-frequency signal, and a secondary winding that is configured to output a second radio-frequency signal; and
the multi-finger transistor according to claim 2, wherein the common input terminal is configured to receive the second radio-frequency signal as the radio-frequency input signal.

6. A power amplifier circuit comprising:
a balun comprising a primary winding that is configured to receive a first radio-frequency signal, and a secondary winding that is configured to output a second radio-frequency signal; and
the multi-finger transistor according to claim 3, wherein the common input terminal is configured to receive the second radio-frequency signal as the radio-frequency input signal.

7. A multi-finger transistor comprising:
a plurality of unit transistors, each unit transistor comprising a first terminal that is electrically connected to a reference potential, a second terminal that is configured to receive a radio-frequency input signal and a bias current, and a third terminal that is configured to output an amplified signal obtained by amplifying the radio-frequency input signal;
a common input terminal that is electrically connected in parallel to the second terminals of the plurality of unit transistors, and that is configured to receive the radio-frequency input signal;
a common bias terminal that is electrically connected in parallel to the second terminals of the plurality of unit transistors, and that is configured to receive the bias current;
a common output terminal that is electrically connected in parallel to the third terminals of the plurality of unit transistors, and that is configured to output the amplified signal;
a plurality of first resistance elements, each resistance element being electrically connected between the common input terminal and the second terminal of a corresponding one of the plurality of unit transistors, and each resistance element being configured to limit a direct current component of the bias current between the second terminals of the plurality of unit transistors; and
a plurality of second resistance elements, each second resistance element being electrically connected between the common bias terminal and the second terminal of a corresponding one of the plurality of unit transistors,
wherein each of the plurality of first resistance elements has a resistance value that is less than a resistance value of a corresponding one of the plurality of second resistance elements.

* * * * *